United States Patent [19]

Welch et al.

[11] Patent Number: 5,017,510

[45] Date of Patent: May 21, 1991

[54] METHOD OF MAKING A SCALABLE FUSE LINK ELEMENT

[75] Inventors: Michael T. Welch, Sugarland; Ronald E. McMann, Rosenberg; Manuel L. Torreno, Jr., Houston; Evaristo Garcia, Jr., Rosenberg, all of Tex.

[73] Assignee: Texas Instruments Incorporated, Dallas, Tex.

[21] Appl. No.: 352,789

[22] Filed: May 25, 1989

Related U.S. Application Data

[62] Division of Ser. No. 57,064, Jun. 1, 1987, Pat. No. 4,862,243.

[51] Int. Cl.⁵ .......................................... H01L 21/48
[52] U.S. Cl. .................................. 437/192; 437/189; 437/922; 148/DIG. 55; 357/71
[58] Field of Search ............... 148/DIG. 55; 437/922, 437/192

[56] References Cited

U.S. PATENT DOCUMENTS

| | | | |
|---|---|---|---|
| 4,413,272 | 11/1983 | Mochizuki et al. | 357/51 |
| 4,455,194 | 6/1984 | Yabu et al. | 437/921 |
| 4,598,462 | 7/1986 | Chandrasekhar | 148/DIG. 55 |
| 4,628,590 | 12/1986 | Udo et al. | 148/DIG. 55 |
| 4,647,340 | 3/1987 | Szluk et al. | 437/245 |
| 4,651,409 | 3/1987 | Ellswork et al. | 437/922 |
| 4,714,949 | 12/1987 | Simmons et al. | 357/51 |
| 4,740,485 | 4/1988 | Sharpe-Geisler | 437/246 |
| 4,744,861 | 5/1988 | Matsunaga et al. | 437/192 |
| 4,792,835 | 12/1988 | Sacarisen et al. | 437/192 |
| 4,954,423 | 9/1990 | McMann et al. | 437/192 |

*Primary Examiner*—Brian E. Hearn
*Assistant Examiner*—Laura M. Holtzman
*Attorney, Agent, or Firm*—B. Peter Barndt; Melvin Sharp; N. Rhys Merrett

[57] ABSTRACT

A fuse link (50) is formed using a method which offers greater scalability of the general conductor system used to wire the device. An oxide mask (36) having the shape of a desired fuse link is formed over a thin metallization layer (34). A barrier layer (38) is formed over the thin metallization layer (34). A conductive layer (40) is formed over the barrier layer (38). A photoresist mask (42) supplied to the conductive layer (40), and the conductive layer is etched to formed interconnects (44, 46). Subsequently, the barrier layer (38) and thin metallization layer (34) are etched, thus rendering a fuse link (50) between interconnects (44, 46) under the oxide mask (36).

19 Claims, 3 Drawing Sheets

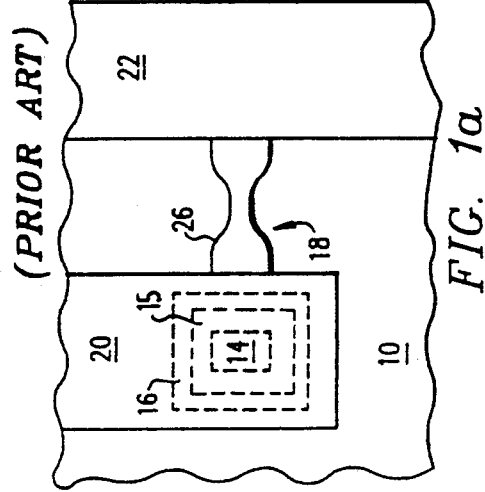
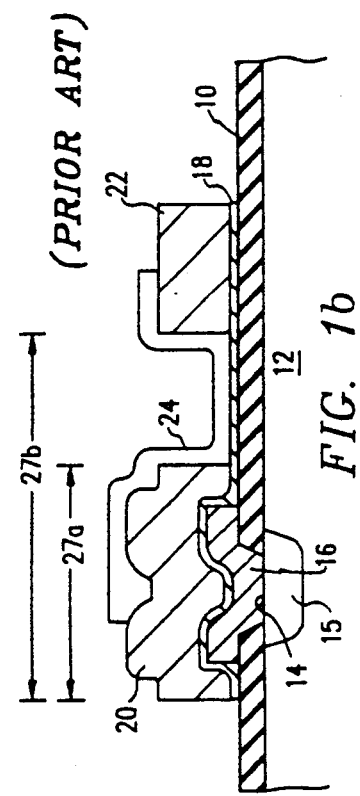
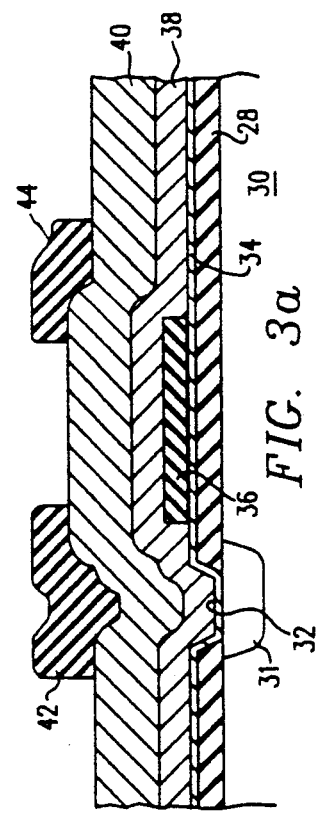
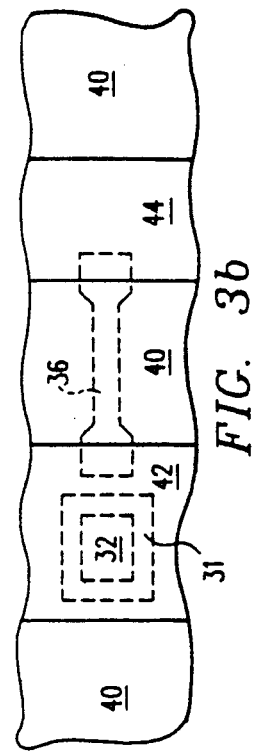
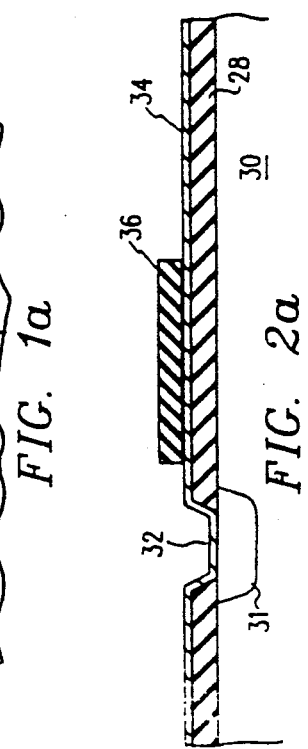
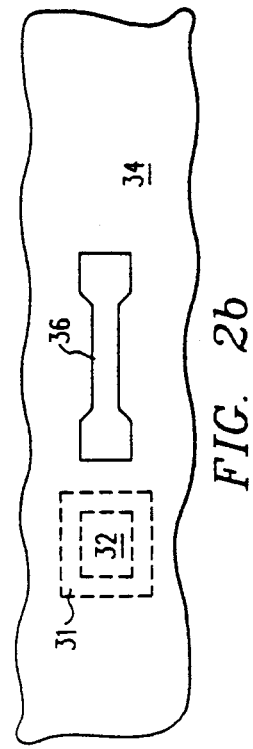

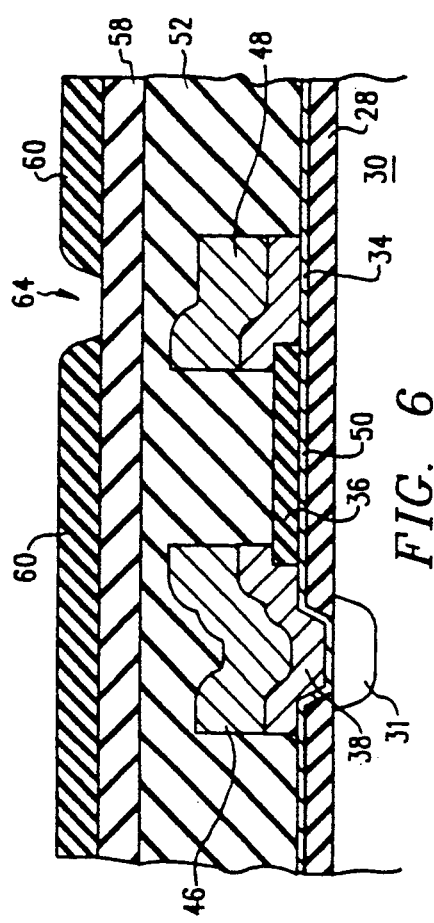
FIG. 6
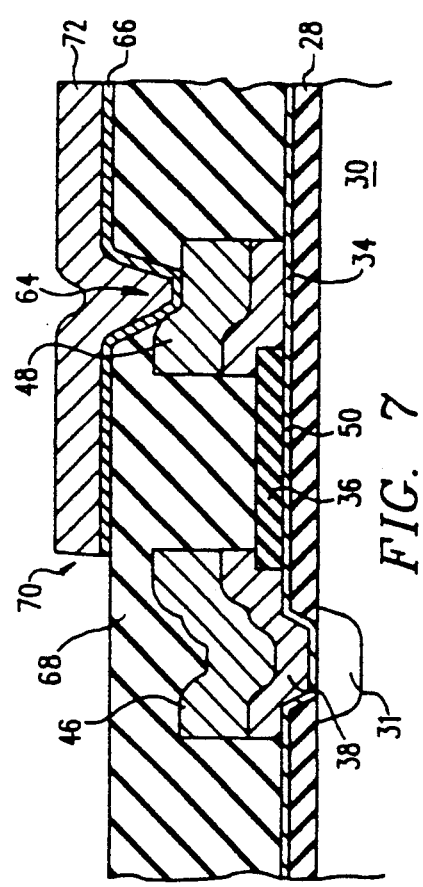
FIG. 7
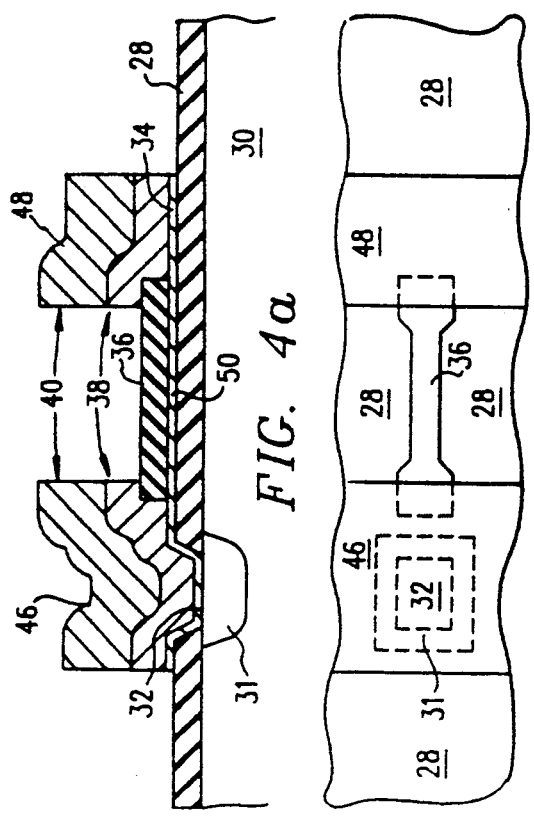
FIG. 4a
FIG. 4b
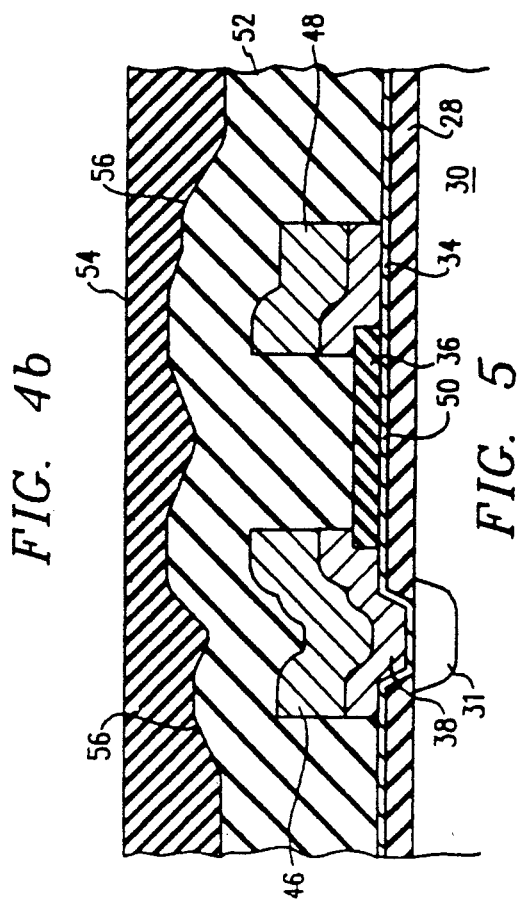
FIG. 5

METHOD OF MAKING A SCALABLE FUSE LINK ELEMENT

This is a division of application Ser. No. 057,064, filed 06/01/87, now U.S. Pat. No. 4,862,243.

TECHNICAL FIELD OF THE INVENTION

This invention pertains generally to fuse links for integrated circuits, and more particularly to an improved fuse link and a method of forming a fuse compatible with both wet etching and dry etching processes.

BACKGROUND OF THE INVENTION

Fuse links have been used for many years in digital integrated circuits, particularly programmable read-only memories (PROMS) and programmable logic arrays (PALS). The fuse links are used to connect matrices of circuit elements for custom applications or for permanent data storage, by selectively breaking unwanted fuse links. Fuse links are broken by various techniques such as selectively applying a sufficiently large current through the unwanted links.

As with many other semiconductor products, increasing integration of devices on a single chip is rapidly obsoleting the processing techniques used to fabricate fuse link devices. Dry plasma etching is increasingly replacing wet chemical etching, providing an increased level of integration. Although dry plasma etching allows smaller device widths and pitches, it can damage sensitive components on the surface of the substrate by overetching. Hence, it is important to minimize interaction between the dry etch and surface components as much as possible.

Scalability is also an important criterion in semiconductor processing. A process which can be easily adapted to smaller components is one which has a high degree of scalability. Previously developed processes for forming a fused link are not adaptable to highly integrated circuits wherein the width of the interconnecting leads and the spaces between the interconnecting leads have substantially decreased.

Furthermore, competitive forces have applied pressure to reduce the price of semiconductor products. Therefore, it is important that semiconductor production be as efficient as possible. The cost of a semiconductor device is largely dependent upon the number of masking levels used in fabricating the device. Thus, it is desirable to reduce the number of masking levels, and the associated critical alignment tolerances required during masking. Previously developed techniques for fabricating fuse links have presented difficulties in reducing the number of mask levels and in reducing alignment tolerances.

Therefore, a need has arisen for a fuse link process which minimizes dry etch damage and over etch of sensitive layers on the surface of the substrate, reduces the number of masking levels and the associated critical alignment of tolerances required during masking, and offers a high degree of scalability by using dry processing as much as possible.

SUMMARY OF THE INVENTION

The present invention disclosed and claimed herein describes a fuse link between two interconnect leads and a method of forming such fuse link which substantially eliminate problems associated with prior methods of forming a fuse link. In one aspect of the present invention, a method for forming a fuse link between two interconnects comprises the steps of forming an insulating mask over a thin metallization layer. The insulating mask is formed in the shape of a fuse link of desired dimensions. A thick metallization layer and a thick conductive layer are formed over the thin metallization layer and the isolating mask. A photoresist mask defining the shape of the interconnects is formed on top of the conductive layer. An in situ etch is performed on the conductive layer, the thick metallization layer, and the thin metallization layer, rendering interconnects having a barrier region comprised of the thick metallization layer. The portions of the thin metallization layer not covered by the first mask or the photoresist mask are removed during the in situ etch, leaving a fuse link connecting the two interconnects.

The present invention provides the technical advantages of minimizing the dry etch damage and over etch of sensitive components on the surface of the substrate, reducing the number of masking levels needed to form the fuse link, and providing a process which is adaptable to reduction in the linewidths of the components.

BRIEF DESCRIPTION OF THE DRAWINGS

FIGS. 1a–b are a top view and a sectional view of a previously developed fuse link disposed between two interconnects;

FIGS. 2a–b illustrate sectional and top views of a first stage of the invention, wherein a isolation oxide layer, metallization layer and a oxide mask are formed on a substrate;

FIGS. 3a–b illustrate cross-sectional and top views of a second stage of the process wherein a second metallization layer is formed, a first conducting layer is formed, and a photoresist pattern for etching the interconnects is applied;

FIGS. 4a–b illustrate cross-sectional and top views of a third stage in the processing wherein the interconnects are formed, the photoresist layer has been removed and the second metallization layer has been etched;

FIG. 5 illustrates a cross-sectional view of a planarization step wherein an oxide and a photoresist layer are formed for planarization purposes;

FIG. 6 illustrates a cross-sectional view of a first stage in forming a optional second level interconnect;

FIG. 7 illustrates a second stage in the formation of a second level interconnect;

DETAILED DESCRIPTION OF THE INVENTION

Figure 8:
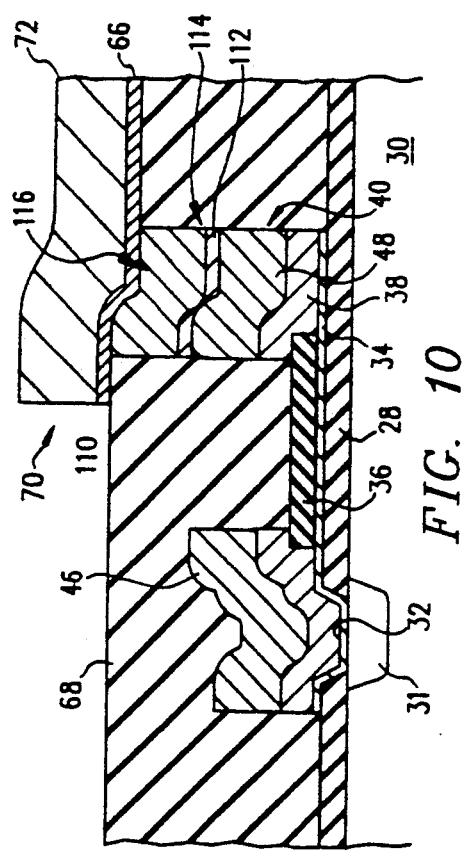
FIG. 8 illustrates a cross-sectional view of a two level embodiment of the present invention having the fuse link on the second level.

The application of the preferred embodiment of the present invention is best understood by referring to FIGS. 1-11 of the Drawings, wherein like numerals are used for like and corresponding parts of the Drawings.

Referring to FIGS. 1a-b of the Drawings, a previously developed process for forming fuse links is illustrated. A doped isolation oxide layer 10 is formed upon a substrate 12 having active devices. The isolation oxide layer 10 is patterned and etched to form an exposed contact pad 14 on the substrate 12 over an active device 15. A barrier layer 16 is formed over the contact pad 14 by producing a thick metallization layer over the isolation oxide 10 and contact pad 14 and then patterning and etching the metallization layer to form the barrier layer 16.

A thin metallization layer 18 is formed over the barrier layer 16 and the isolation oxide 10. A thick conducting layer is formed over the thin metallization layer 18, and is subsequently patterned and etched to form the interconnects 20 and 22. After forming the interconnects 20 and 22, a photoresist pattern 24 is placed over the interconnects and the thin metallization layer 18. The portions of the thin metallization layer 18 which are not covered by either the photoresist pattern 24 or the interconnects 20 and 22 are etched away, exposing the isolation oxide layer 10. The portion of the thin metallization layer 18 remaining under the photoresist pattern 24 forms the fuse link 26. The photoresist pattern 24 is removed after etching.

The barrier layer 16 is necessary to protect the silicon substrate from reacting with the aluminum used in the interconnects 20 and 22, while providing electrical conduction between the substrate 12 and the interconnects 20 and 22, since aluminum can have an unfavorable reaction with the silicon. The barrier layer needs to be fairly thick to provide a sufficient barrier between the substrate 12 and the interconnects 20 and 22 in the range of 1200-2000 angstroms.

There are several disadvantages associated with the previously developed process for forming fuse links. One problem with the previously developed process is the incompatibility of the process with dry etching techniques necessary to produce interconnects having small linewidths. Because the wet etch has a large undercut characteristic, wet etching techniques can no longer be used once the linewidths 27a or the pitch 27b of the interconnects 20 and 22 have been scaled down in order to increase integration in the semiconductor device. Wet etch has an undercut characteristic of approximately one micron per side. For an interconnect having a relatively large line width, for example, a seven micron linewidth, the interconnect can be oversized to account for the one micron loss at each side. However, as the linewidths 27a of the interconnects 20 and 22 and the spaces in between interconnects are reduced, the undercut characteristic cannot be controlled sufficiently accurately to produce consistent results. Thus, for linewidths of 3 microns or less, it is necessary to use a dry etch.

Consequently, it is preferable to use dry etching techniques for highly integrated devices. Dry etches, however, remove the doping from the surface of the isolation oxide layer 10 when the substrate 12 and dry etch interact. Since the doping is necessary to prevent surface inversion, it is important that a sufficient amount of doping remain in the isolation oxide layer 10 after completion of the etching processes. In the previously developed process described above, the isolation oxide layer 10 is etched twice: once in etching the barrier layer 16, and again in etching the fuse link 26 from the thin metallization layer 18.

Another problem associated with the previously developed process is the complexity in forming the photoresist pattern 24 used to mask the fuse link 26 during etching of the thin metallization layer 18. Since the interconnects 20 and 22 have been formed prior to etching the thin metallization layer 18, it is necessary to form the photoresist pattern 24 over steps formed by the interconnects 20 and 22. Although this problem can be somewhat mitigated by using a "sloped etch" which produces sloping edges on the interconnects 20 and 22, accurate formation of the photoresist pattern on sloped edges is considerably less reliable than forming the photoresist pattern on a flat surface. Furthermore, as the valley between interconnects decreases in width, applying the photoresist pattern 24 within the valley becomes increasingly difficult, thus reducing the scalability of the process.

A third problem with the previously developed process is the number of masks necessary to complete the process. The previously developed process uses a first mask for the barrier layer, a second mask to form the interconnects 20 and 22, and a third mask to form the fused link 26. Since the complexity of the process is generally based on the number of masks used, it is desirable to reduce the masks as far as possible. Furthermore, the elimination of a masking level significantly reduces the degree of misalignment.

Referring now to FIGS. 2a-b, a first stage in the process used in the present invention is illustrated. In a first process step, a doped isolation oxide layer 28 is formed upon a substrate 30. In the preferred embodiment, the isolation oxide layer 28 is thermally grown, and doped using a phosphorus doping. Generally, the isolation oxide has a thickness ranging between 2500 and 3000 angstroms, with a preferred value of about 2800 angstroms. The purpose of the isolation oxide layer 28 is to isolate the substrate 30 from conducting elements which connect active devices, and to prevent surface inversion.

In a second process step, the isolation oxide layer 28 is patterned and etched to provide a contact region 32 over the active device 31. The isolation oxide layer 28 may be etched using common oxide etch (COE) for a wet etch or a fluorinated plasma for a dry etch.

In a third step of the first stage, a thin metallization layer 34 is formed over the isolation oxide layer 28 and the contact region 32. The thin metallization layer 34 has a thickness of between 400 and 500 angstroms. The thin metallization layer will be used in a later step to form the fuse link. Preferably, the thin metallization layer 34 is formed from a titanium-tungsten material (hereinafter "Ti:W"). However, other materials could be used such as a polycrystalline silicon with platinum. Ti:W is generally preferred over other substances since the titanium has been found to diffuse into the silicon and the aluminum used for the interconnects, thus providing increased conductivity and a superior adhesion. Generally, sputtering techniques are used to deposit the Ti:W material on the isolation oxide layer 28 and the contact region 32.

After forming the thin metallization layer 34, an oxide mask 36 is formed on the metallization layer 34 in the shape of the desired fuse link. The oxide mask 36 is formed by depositing an oxide layer over the thin metallization layer 34 and subsequently patterning and etching the oxide layer to form the oxide mask 36. The oxide mask generally ranges between 1000 and 2000 angstroms in thickness, and may be deposited using chemical vapor deposition (CVD) techniques. A fluorinated etch which is about 15:1 selective to the metallization layer 34 is used to etch the oxide mask 36. It should be noted that the same mask used to form the fuse link 26 in the previously developed process illustrated in FIG. 1 may also be used to form the oxide mask 36 in the process of the present invention.

Referring now to FIGS. 3a-b, a second processing stage in accordance with the present invention is disclosed. A barrier layer 38 is formed over the thin metallization layer 34 and the oxide mask 36, using sputtering techniques. The barrier layer has a thickness in the range of 1500 to 2000 angstroms. Preferably, the barrier layer 38 is also made from a Ti:W material.

A conductive layer 40 is formed over the barrier layer 38. The conductive layer will subsequently be used to form the interconnects and therefore should be formed of a material which is highly conductive. Preferably, the conductive layer 40 comprises an aluminum or copper-doped aluminum material. The aluminum or copper-doped aluminum material may be deposited using sputtering, evaporation or CVD techniques. The thickness of the aluminum conductor is typically within a range of 7000 to 8000 angstroms in thickness.

Photoresist masks 42 and 44 are formed over the conductive layer 40, outlining the interconnect pattern. The photoresist masks 42 and 44 can be produced using standard lithographic techniques.

Referring now to FIGS. 4a-b, the final stage in processing the fusible link is illustrated. As will be described below, the final processing stage may be accomplished using either dry etching techniques or wet etching techniques, rendering beneficial results using either technique.

Using dry etching techniques, the aluminum layer is etched in a chlorinated plasma. During the chlorinated plasma etch, the interconnects 46 and 48 are formed. The chlorinated plasma etch is approximately 5 to 1 selective to Ti:W. After the conductive layer 40 has been etched down to the level of the barrier layer 38, a fluorinated plasma etch may be performed on the barrier layer 38 and the thin metallization layer 34. Since the fluorinated plasma etch is selective to oxide, the oxide mask 36 will not be etched through. Hence, only the portions of the barrier layer masked by the interconnects 46 and 48 will remain, and only the portions of the thin metallization layer 34 masked by the remaining barrier layer 38 and the oxide mask 36 will remain. The remaining portion of the thin metallization layer 34 under the oxide mask 36 will form the fuse link 50.

Use of dry etching techniques with the disclosed process renders several advantages over the previously developed process. The previously developed process requires two separate etch steps which must selectively stop on active semiconductor components. Since current dry etch techniques do not obtain the selectivities required to achieve contact with the active semiconductor components without harmful thinning of the critical component oxides, the previously developed process does not lend itself to dry etching techniques. In the disclosed process, only one etch step is used which requires high selectivity to the critical layers, since the disclosed process forms the fuse link during the final portion of the normal barrier etch step. Current metal dry etch techniques insure sufficient selectivity to the critical underlying layers to withstand a single dry etch step.

A key advantage in using the disclosed process with dry metal etching occurs when the conductor pitches (the width of the conductor plus the space between conductors) are less than or equal to five microns. In this instance, dry etch of conductors and fuse links is preferred over wet chemical etching because of the greater linewidth control during pattern transfer. For example, a fusible link can be patterned to the exact width required to yield a fuse with specific characteristics with predictable results using dry etch techniques. On the other hand, the wet etch process has poor linewidth control, making the fuse characteristics somewhat unpredictable, necessitating testing of the fuses after they are formed. However, the anisotropic characteristic of some dry etches may result in metal filaments remaining at the steps of the interconnects. These filaments will not normally occur with a wet etch.

If wet etching techniques are to be used with the disclosed process of the present invention, a hydrogen peroxide solution may be used to etch the Ti:W layers, and a solution of phosphoric acid, acetic acid, nitric acid, and a wetting solution may be used to etch the aluminum layers.

The disclosed process offers several advantages over the previously developed process when used with either wet etching techniques or dry etching techniques. First, the previously developed process requires that the fuse link be formed by a photoresist mask over the steps formed by the interconnects 20 and 22. In the present process, however, the fuse link is formed by an oxide mask 36 patterned on a flat surface. Therefore, the formation of the fuse link can be much more accurately controlled. Secondly, the number of masks and the number of separate etching steps is reduced by the process of the present invention. In the previously developed process, three masks and three separate etching steps were required: (1) formation of the barrier layer, (2) formation of the interconnects, and (3) formation of the fuse link. In the present process, only two masks are needed, one for the oxide mask 36 and one for the interconnects 46 and 48. A separate step is not required to form the barrier layer.

A third advantage available to both wet etch and dry etch techniques is the improved alignment tolerance provided by the present process. Since the barrier layer and interconnects are formed using one masking step, they are automatically aligned.

Referring now to FIGS. 5-7, the additional processing steps of planarization and via etching are illustrated. In FIG. 5, a thick oxide layer 52, typically around 18,000 angstroms, is deposited on the fuse link structure of FIG. 4, completely covering the interconnects 46 and 48. The oxide layer 52 used as a dielectric may be deposited using CVD oxide deposition techniques. A photoresist layer 54 is formed on top of the oxide layer 52 to smooth out the steps 56 in the oxide layer 52. At its thinnest point, the photoresist layer 54 measures approximately 4,000 angstroms in thickness, increasing to approximately 15,000 angstroms at its thickest point. The oxide layer 52 and photoresist layer 54 are etched at the same rate using a non-selective etch such as a fluorinated plasma. The oxide layer 52 is etched to a level sufficiently above the interconnects 46 and 48 such that the oxide layer 52 completely covers the interconnect 46 or 48, as shown in FIG. 6.

A oxide redeposition layer 58 is deposited on top of the etched oxide layer 52. The oxide redeposition layer 58 guarantees that the dielectric thickness between the top of the interconnects 46 and 48 will be a least 7000 angstroms. Also, a fresh layer of oxide may operate to seal pinholes in the oxide layer 52 caused during the planarization etch has a result of pinholes in the photoresist layer 54.

Referring again to FIG. 6, a patterned photoresist layer 60 is formed on the oxide redeposition layer 58 to form a window or "via" 64 to a first level interconnect. In the illustrated embodiment, the via 62 is formed over interconnect 48. The patterned photoresist layer 60 exposes the via 64 above the interconnect 48. The patterned photoresist layer 60 may be formed using standard lithographic techniques.

Referring now to FIG. 7, a non-selective etch is performed on the patterned photoresist layer 60, oxide redeposition layer 58 and the remaining oxide layer 52, such that the via 64 is formed through the oxide layer 52 onto the interconnect layer 48. A second thin metallization layer 66 is deposited on top of the remaining oxide layers 52 and 58 (hereinafter "dielectric" 68). A second thick conductive layer 70 is formed on top of the thin metallization layer 66.

The second thin metallization layer 66 and second thick conductor layer 70 are patterned and etched using either wet etch or dry etch techniques to form the second level interconnects, shown in FIG. 7 as the second level interconnect 72. The use of more than one level of interconnects allows greater complexity while maintaining the same chip size.

FIGS. 8-11 illustrate alternative embodiments of the fuse link with a multi-layer interconnect system. In FIG. 8, an embodiment is illustrated in which the fuse link is disposed between interconnects on the second level. In this embodiment, a doped isolation oxide layer 74 is deposited upon a substrate 76. The isolation oxide layer 74 is etched to form a contact region 78 on the substrate 76. A thick metallization layer 80 is deposited over the isolation oxide layer 74 and the contact region 78. A conductive layer 82 is deposited over the thick metallization layer 80. The conductive layer 82 is patterned and etched to form the first level interconnect 84. Both the conductive layer 82 and the thick metallization 80 are etched in this step, such that a barrier pad 86 is formed between the first level interconnect 84 and the contact region 78. Since there is no fuse link on the first level, there is no need to form a thin metallization layer on the first layer. After etching the interconnect, the first level is planarized as illustrated in FIGS. 5 and 6, and a via etch is performed as illustrated in FIGS. 6 and 7.

After performing the via etch, a thin metallization layer 88 is deposited on the dielectric 90 and the exposed region 92 of the first level interconnect 84. A oxide mask 94 is deposited on top of the thin metallization layer 88 and the oxide mask 94 is patterned and etched to form the desired fuse link design. Subsequently, a barrier layer 96 and a conductive layer 98 are sequentially deposited on the thin metallization layer 88 and the oxide mask 94. The conductive layer 98 is patterned and etched as described in FIGS. 2 and 3 to form the interconnects 100 and 102 and the fuse link 104 therebetween. If desired, additional layers may be formed using the previously discussed techniques.

Figure 9:
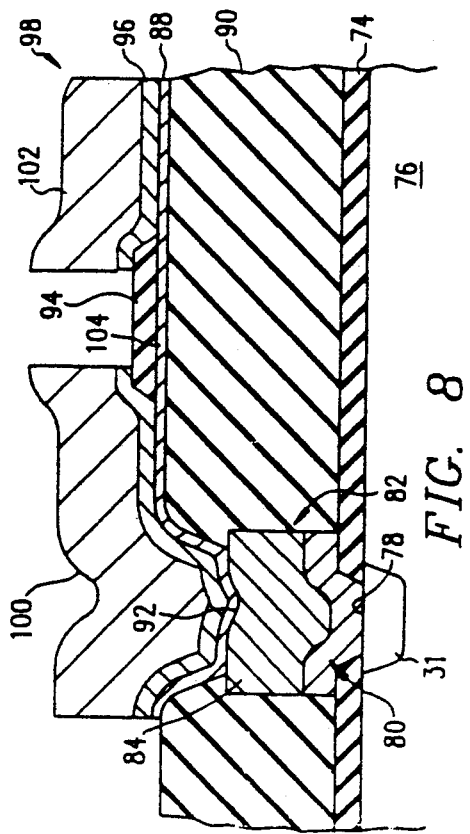
FIG. 9 illustrates a cross-sectional view of an alternative embodiment of a second level fuse link, using a tungsten plug between levels.

FIG. 9 illustrates a two-level interconnect system with a fuse link on the second level, wherein a tungsten plug is used as a pass-through between the first and second levels. In the illustrated embodiment, the first level interconnect is formed as described in connection with FIG. 8. However, rather than performing a via etch, a non-sloping etch is used to create a pass-through 108 in the planarized dielectric layer 90. The non-sloping etch may be performed by treating the resist with deep ultraviolet (Deep UV) light to preserve the non-sloping angle of the resist and by reducing the oxygen level in the fluorinated plasma etch. In the preferred embodiment, the pass-through 108 is filled with a tungsten material in one of two ways. First, the tungsten may be deposited selective to the hole formed in the dielectric layer 90; i.e., the tungsten is deposited such that it fills the pass-through 108 from the bottom up. Alternatively, a non-selective tungsten deposition may be used, followed by a planarization. While tungsten is used in the preferred embodiment, other suitable materials may be substituted which will conduct between the first and second level interconnects.

Following the formation of the tungsten pass-through 108, the second level interconnects are formed as described in connection with FIG. 8. An advantage of using a tungsten pass-through 108 as opposed to the via connection of FIGS. 7 and 8, is that the tungsten pass-through embodiment provides a superior interlevel contact between the interconnects.

Figure 10:
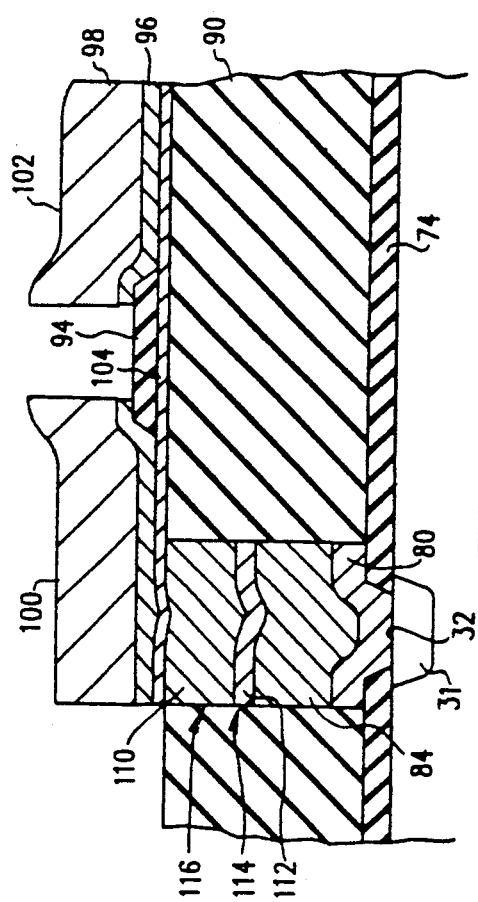
FIG. 10 illustrates another embodiment of the present invention using a aluminum pillar between two levels with the fuse link implemented on the first level.

Referring now to FIG. 10, the present invention is used in an embodiment using a conductive pillar to connect separate interconnect levels. In this embodiment, a pillar 110 and an underlying metallization layer 112 are disposed on top of a first level lead to connect the first level lead to a second level lead.

In this embodiment, the metallization level layer 34, oxide mask 36, barrier layer 38, and conductive layer 40 are formed as described in connection with FIGS. 2 and 3. On top of the conductive layer 40, a etch barrier 114 and a pillar layer 116 are formed In the preferred embodiment, the etch barrier 114 comprises a Ti:W layer and the pillar layer 116 comprises an aluminum or aluminum-copper layer.

The layers are masked and etched to form the pillars and the interconnects. The fuse link is formed in an etching step as described in connection with FIG. 4. The processing steps employed to create the pillared connection are detailed in U.S. Pat. No. 4,954,423, entitled Planar Metal Interconnection for a VLSI Device filed Mar. 13, 1987, the substance of which is incorporated herein.

Figure 11:
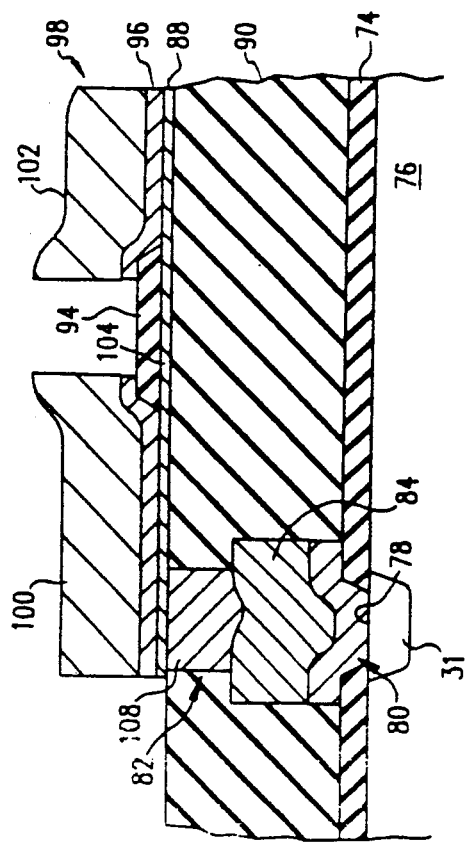
FIG. 11 illustrates a cross-sectional view of an alternative embodiment of the present invention using an aluminum pillar between levels, with the fuse link on the second level.

Referring now to FIG. 11, another embodiment having two levels of interconnects, connected by a pillared structure is illustrated. In this embodiment the fuse link is formed on the second level of interconnects. After forming the pillared connection as described in U.S. Pat. No. 4,954,523, the second level of interconnection with the fuse link is formed as described in connection with FIGS. 1-4.

Although a preferred embodiment of the invention has been described in detail, it should be understood that the various changes, substitutions and alterations can be made therein without departing from the spirit and scope of the invention as defined by the appended claims.

What is claimed is:

1. A method for forming a fuse link between two interconnects, comprising the steps of:
    forming a first conductive layer;

forming a first mask in the shape of a fuse link of desired dimensions on said first conductive layer;

forming a second conductive layer over said mask and over portions of said first conductive layer not covered by said mask;

forming a third conductive layer over said second layer;

forming a second mask over portions of said third conductive layer;

removing portions of said second and third conductive layers not covered by said second mask, the interconnects comprising the remaining portions of said third conductive layer; and removing portions of said first conductive layer not covered by said first mask or said second mask, remaining portions of said first conductive layer under said first mask forming the fuse link.

2. The method of claim 1 wherein said first conductive layer is thinner than said second conductive layer and comprises a titanium-tungsten material.

3. The method of claim 1 wherein said first conductive layer has a thickness of between 400 and 500 angstroms.

4. The method of claim 1 wherein said second conductive layer comprises a titanium-tungsten material.

5. The method of claim 1 wherein said second conductive layer has a thickness between 1500 and 2000 angstroms.

6. The method of claim 1 wherein said third conductive layer comprises an aluminum material.

7. The method of claim 6 wherein said third conductive layer comprises an aluminum-copper alloy.

8. The method of claim 1 wherein said first mask comprises an insulating material.

9. The method of claim 8 wherein said insulating material is silicon dioxide.

10. The method of claim 1 wherein said second mask comprises an photoresistive material.

11. The method of claim 1 wherein said first, second and third conductive layers are etched in situ.

12. The method of claim 1 and further comprising the step of forming a doped oxide layer prior to forming said first conductive layer.

13. The method of claim 12 and further comprising the step of forming a window through said doped oxide layer onto an active device, said first conductive layer being formed upon said doped oxide layer and the portion of said substrate exposed through said window.

14. A method for forming a fuse link between two interconnects, comprising the steps of:

forming a first layer of electrically conducting material operable for use in a fuse link;

forming a first mask over said first layer, said mask being formed of an electrical isolator;

forming a second layer of electrically conducting material over said first layer and said first mask;

forming a third layer of electrically conducting material over said second layer;

applying a second mask over said third layer; and etching portions of said first, second and third layers not covered by either said first mask or said second mask, thereby forming the fuse link under said first mask.

15. The method of claim 14 wherein said etching comprises dry etching.

16. The method of claim 14 wherein said first mask is formed of silicon dioxide.

17. The method of claim 14 wherein said first and second layers are titanium-tungsten and said second layer comprises an aluminum alloy.

18. The method of claim 14 and further comprising the steps of forming an interconnect on a second level and connecting said second level interconnect to the first level interconnect.

19. The method of claim 18 wherein said second level interconnect is formed above said above first level interconnects.

* * * * *